United States Patent
Kitajima

(10) Patent No.: US 8,736,022 B2
(45) Date of Patent: May 27, 2014

(54) SEMICONDUCTOR DEVICE WITH A DIODE-TYPE ESD PROTECTION CIRCUIT

(75) Inventor: Yuichiro Kitajima, Chiba (JP)

(73) Assignee: Seiko Instruments Inc. (JP)

( * ) Notice: Subject to any disclaimer, the term of this patent is extended or adjusted under 35 U.S.C. 154(b) by 222 days.

(21) Appl. No.: 12/378,177

(22) Filed: Feb. 11, 2009

(65) Prior Publication Data
US 2009/0206439 A1    Aug. 20, 2009

(30) Foreign Application Priority Data
Feb. 19, 2008  (JP) .................................. 2008-037033

(51) Int. Cl.
*H01L 27/02*    (2006.01)
(52) U.S. Cl.
USPC .................... 257/546; 257/355; 257/E27.028
(58) Field of Classification Search
USPC ................................. 257/355, E27.028, 546
See application file for complete search history.

(56) References Cited

U.S. PATENT DOCUMENTS

2005/0110092 A1* 5/2005 Chen et al. .................... 257/355
2006/0001101 A1* 1/2006 Hirata ............................ 257/355

OTHER PUBLICATIONS

Patent Abstracts of Japan, publication No. 11-068043, publication date Mar. 9, 1999.

* cited by examiner

*Primary Examiner* — Hsin-Yi Hsieh
(74) *Attorney, Agent, or Firm* — Adams & Wilks

(57) ABSTRACT

A semiconductor device has a semiconductor chip, an internal circuit region arranged on an inner side of the semiconductor chip, and a bonding pad region arranged adjacently to the internal circuit region. A diode-type ESD protection circuit is formed of a junction between a first conductivity type diffusion layer for fixing a substrate potential of the semiconductor chip and a pair of second conductivity type diffusion layers arranged on an inner side of the first conductivity type diffusion layer. The first conductivity type diffusion layer is arranged on an entire peripheral region or a part of the peripheral region of the semiconductor chip with the peripheral region being outside of the internal circuit region and the bonding pad region. One of the pair of second conductivity type diffusion layers comprising a diffusion layer for breakdown adjustment at a junction portion with the first conductivity type diffusion layer.

11 Claims, 8 Drawing Sheets

SEMICONDUCTOR DEVICE WITH A DIODE-TYPE ESD PROTECTION CIRCUIT

BACKGROUND OF THE INVENTION

1. Technical Field

The present invention relates to a semiconductor device including an electrostatic discharge (ESD) protection circuit for preventing breakdown of the semiconductor device caused by ESD.

2. Background Art

Breakdown due to noise such as electrostatic discharge (ESD) (hereinafter, referred to as ESD) can be named as an important matter to be concerned in ensuring reliability of ICs. Since ESD is an event that possibly occurs in various situations, it is necessary to take measures so as to avoid breakdown of ICs due to the noise.

In semiconductor devices such as ICs, ESD phenomena are classified into several models according to charged objects and discharge forms. Typical models include a human body model (HBM) in which static electricity accumulated in a charged human body discharges to a semiconductor device, a machine model (MM) in which an object having high capacity and low resistance, such as a metal apparatus processing a semiconductor device in a manufacturing process for IC, is assumed to be a generation source of static electricity, a charged device model (CDM) in which a semiconductor device itself is assumed to be charged to perform discharge to others, and the like.

In order to ensure reliability of the semiconductor devices such as ICs, it is necessary to perform simulated ESD on the basis of those discharge models, and to evaluate presence of sufficient immunity.

In an IC, in order to prevent the breakdown due to ESD as described above, various technologies have been conventionally developed and an ESD protection circuit is provided in the IC.

As a conventional ESD protection circuit, a structure illustrated in FIG. 8 is exemplified (for example, JP 11-68043 A). An n+ diffusion layer 201 which becomes a drain of a MOS transistor on a p-type substrate 204 is divided into at least two diffusion regions to be formed in an n-well diffusion layer 203 having the same type. At least one or more p+ diffusion layers 202 having a different type are formed in the n-well diffusion layer 203. The p+ diffusion layer 202 is connected to a substrate potential. In this method, owing not only to a diode formed by a junction between the n-well diffusion layer 203 and the p-type substrate 204 but also to a diode including the n-well diffusion layer 203 and the p+ diffusion layer 202 formed in the n-well diffusion layer 203, a high protection effect can be obtained against ESD irrespective of an application mode of ESD.

Through the progress of miniaturization technologies in the manufacture of a semiconductor device, a reduction of a chip size is accelerated and an internal circuit is made smaller. In the semiconductor device, however, demands for high immunity to ESD never stop in the market to protect the semiconductor device from ESD destruction. The semiconductor device has thus come to a stage in which uniform reduction of a size of the ESD protection circuit similar to the internal circuit is impossible. As a result, the proportion of the ESD protection circuit occupying the chip area becomes larger, and a problem of restriction occurs from the size of the ESD protection circuit even in a plan for lowering manufacturing costs by reducing the chip size.

Besides, the conventional ESD protection circuit may have sufficient immunity in the test method based on the conventional models such as HBM, MM, and CDM. In recent years, however, it has been required to obtain sufficient immunity also with respect to models referred to as an aerial discharge test and a contact discharge test stricter than the conventional models, and thus sufficient immunity cannot be obtained with the use of the conventional ESD protection circuit.

Eventually, since it is necessary to make the size of the ESD protection circuit itself lager, a reducing tendency significantly appears in cost advantage along the chip size reduction by the miniaturization technologies.

SUMMARY OF THE INVENTION

In order to solve the above-mentioned problems and to provide a semiconductor device having sufficient immunity to ESD destruction while reducing a chip area, the present invention employs the following means.

(1) A semiconductor device including an ESD protection circuit, characterized in that: a diode-type ESD protection circuit formed by a junction between a first conductivity type diffusion layer and a second conductivity type diffusion layer is formed on an entire peripheral region or a part of the peripheral region of a chip; and a diffusion layer formed so as to fix a substrate potential of the chip and electrically connected to a power source or a ground provided in the peripheral region of the chip is used for any one of the first conductivity type diffusion layer and the second conductivity type diffusion layer.

(2) A semiconductor device characterized in that, in the diode-type ESD protection circuit formed by the junction between the first conductivity type diffusion layer and the second conductivity type diffusion layer, the junction of the first conductivity type diffusion layer and the second conductivity type diffusion layer is joined in a linear shape in a plane.

(3) A semiconductor device characterized in that, in the diode-type ESD protection circuit formed by the junction between the first conductivity type diffusion layer and the second conductivity type diffusion layer, the junction of the first conductivity type diffusion layer and the second conductivity type diffusion layer is joined in a rectangular shape in a plane.

(4) A semiconductor device characterized in that, in the diode-type ESD protection circuit formed by the junction between the first conductivity type diffusion layer and the second conductivity type diffusion layer, the junction of the first conductivity type diffusion layer and the second conductivity type diffusion layer is joined in a wave shape in a plane.

(5) A semiconductor device characterized in that, in the diode-type ESD protection circuit formed by the junction between the first conductivity type diffusion layer and the second conductivity type diffusion layer, the junction of the first conductivity type diffusion layer and the second conductivity type diffusion layer is joined in a wedge shape in a plane.

In the present invention, the diode-type ESD protection circuit formed by the junction between the first conductivity type diffusion layer and the second conductivity type diffusion layer is formed in an entire peripheral region or a part of the peripheral region outside of internal circuits and bonding pads of the chip, in which a diffusion layer formed in the peripheral region of the chip to fix the substrate potential of the chip and electrically connected to a power source or a ground is used for any one of the first conductivity type diffusion layer and the second conductivity type diffusion layer, permitting enlargement of the size of the ESD protection circuit without increasing the chip area, and enhancement of the immunity to ESD destruction of the semiconductor device.

DETAILED DESCRIPTION OF THE PREFERRED EMBODIMENTS

Hereinafter, a detailed description is made on a best mode according to the present invention with reference to the drawings.

Figure 1:
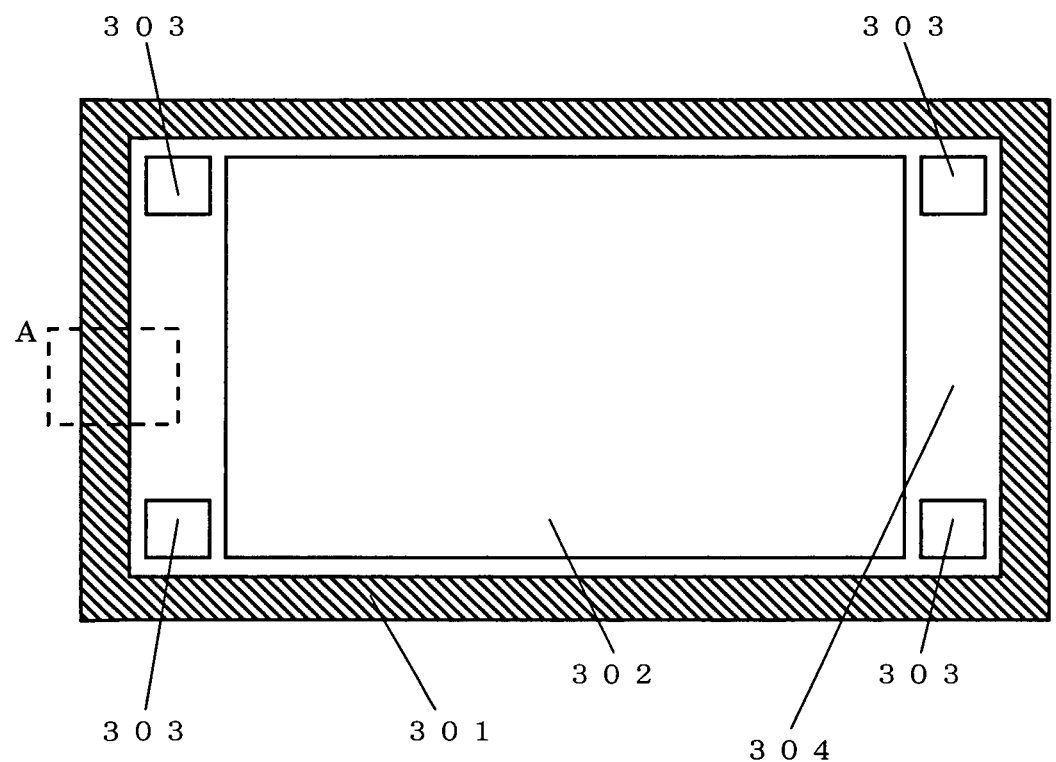
FIG. 1 is a schematic view illustrating a structure of a semiconductor device according to an embodiment of the present invention.

FIG. 1 is a plan view illustrating an entire chip of a semiconductor device including an ESD protection circuit in the present invention. The chip is structured, as illustrated in FIG. 1, by arranging an internal circuit region 302 and bonding pad regions 303 in an internal portion 304 and by arranging an ESD protection circuit region 301 in a chip peripheral portion.

Figure 2:
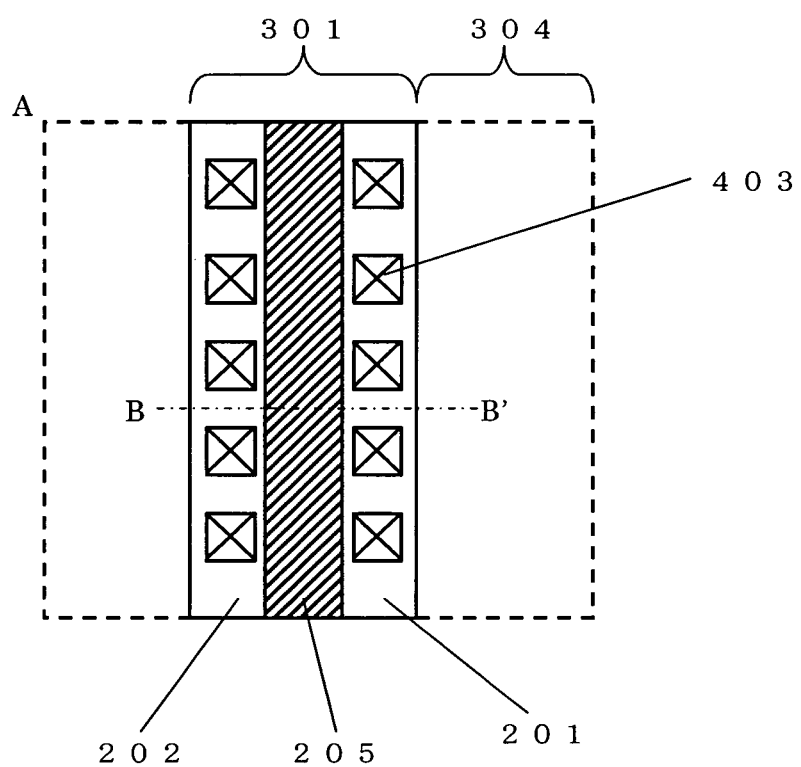
FIG. 2 is a schematic view illustrating a structure of a semiconductor device according to an embodiment of the present invention.

FIG. 2 is a detailed plan view obtained by enlarging a region A. The ESD protection circuit region 301 illustrated in FIG. 1 is formed of a p+ diffusion layer 202 provided in the chip peripheral portion so as to fix a substrate potential, an n-type diffusion layer 205 for breakdown voltage adjustment, which is provided so as to adjust a breakdown voltage of a diode, and an n+ diffusion layer 201. The p+ diffusion layer 202 and the n+ diffusion layer 201 are each formed with contacts 403, the p+ diffusion layer 202 is electrically connected to a ground, and the n+ diffusion layer 201 is electrically connected to a power source or other bonding pads. The p+ diffusion layer 202, the n-type diffusion layer 205 for breakdown voltage adjustment, and the n+ diffusion layer 201 are formed to join linearly in a plane.

Figure 3:
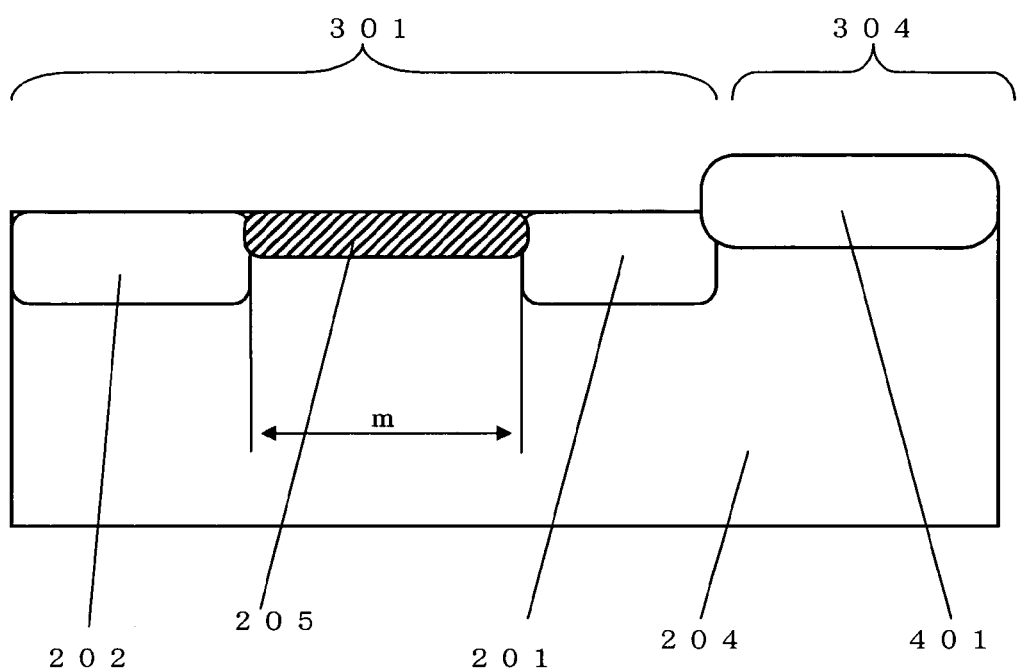
FIG. 3 is a schematic view illustrating a structure of a semiconductor device according to an embodiment of the present invention.
Figure 4:
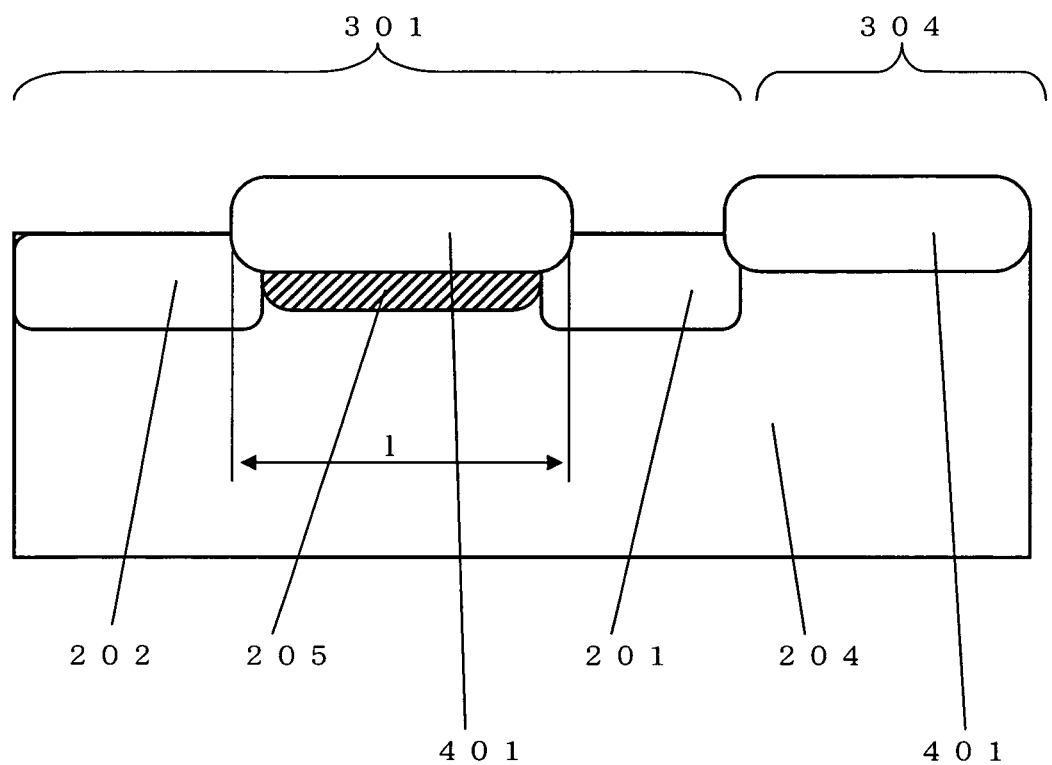
FIG. 4 is a schematic view illustrating a structure of a semiconductor device according to an embodiment of the present invention.

FIG. 3 is a sectional view taken along the dashed line B-B' illustrated in FIG. 2. The p+ diffusion layer 202, the n-type diffusion layer 205 for breakdown voltage adjustment, and the n+ diffusion layer 201 of the ESD protection circuit region 301 are formed on a p-type substrate 204. Since a diffusion layer provided in the chip peripheral portion to fix the substrate potential is p-type in a case of using a p-type substrate as in this example, the n-type diffusion layer 205 for breakdown voltage adjustment and the n+ diffusion layer 201 are joined to the p+ diffusion layer 202 to form a pn junction, whereby a diode-type ESD protection circuit is formed. The diode-type ESD protection circuit has to be set so as not to operate within a range of an operating voltage of the semiconductor device and set to be turned on before large load due to ESD is applied on the internal circuit. Accordingly, in the n-type diffusion layer 205 for breakdown voltage adjustment, the maximum voltage applied to the semiconductor device or the maximum rated voltage ensured by the semiconductor device and a breakdown voltage of an element used in the internal circuit are taken into consideration, whereby concentration and a width m illustrated in FIG. 3 are adjusted so that the diode-type ESD protection circuit operates. The n-type diffusion layer 205 for breakdown voltage adjustment does not cause any problems even when formed under a device isolation 401 as illustrated in FIG. 4. In a case where the n-type diffusion layer 205 for breakdown voltage adjustment is formed under the device isolation 401, a width 1 and the like are also adjusted. Further, the n-type diffusion layer 205 for breakdown voltage adjustment need not always be an n-type diffusion layer, and a case is also conceived in which a diffusion layer itself is not necessary to be formed depending on a target breakdown voltage.

Next, the operation of the diode-type ESD protection circuit is described. In a case where, with respect to the p+ diffusion layer 202, positive noise is applied by ESD to the n+ diffusion layer 201 which is electrically connected to the power source or other bonding pads, a reverse bias is applied to the pn junction of the diode-type ESD protection circuit, and the pn junction undergoes avalanche breakdown when the diode-type ESD protection circuit reaches a certain voltage to thereby start to flow a current. With this, it is possible to allow the ESD noise to escape before load due to ESD is applied to the internal circuit. Conversely, in a case where, with respect to the p+ diffusion layer 202, negative noise is applied by ESD to the n+ diffusion layer which is electrically connected to the power source or other bonding pads, a forward bias is applied to the pn junction of the diode-type ESD protection circuit. Accordingly, the diode-type ESD protection circuit enters a state in which a current is allowed to flow, which enables the ESD noise to escape.

Hereinabove, the description has been made with reference to the p+ diffusion layer 202. However, even when the n+ diffusion layer 201 is set to a reference and the ESD noise is injected to the p+ diffusion layer 202, a similar operation to that described above is performed by a bias applied to the pn junction within the diode-type ESD protection circuit, whereby an operation of protecting the internal circuit from the ESD noise is performed.

In the present invention, use of the diffusion layer in the chip peripheral region provided to fix the substrate potential of the chip as one of the diffusion layers of the pn junction of the diode-type ESD protection circuit, and formation of the diode-type ESD protection circuit in space existing between the chip peripheral region and the internal circuit permit enlargement of the size of the diode-type ESD protection circuit without increasing the chip area, and supply of the semiconductor device having sufficient immunity to ESD destruction while reducing the chip area.

Figure 5:
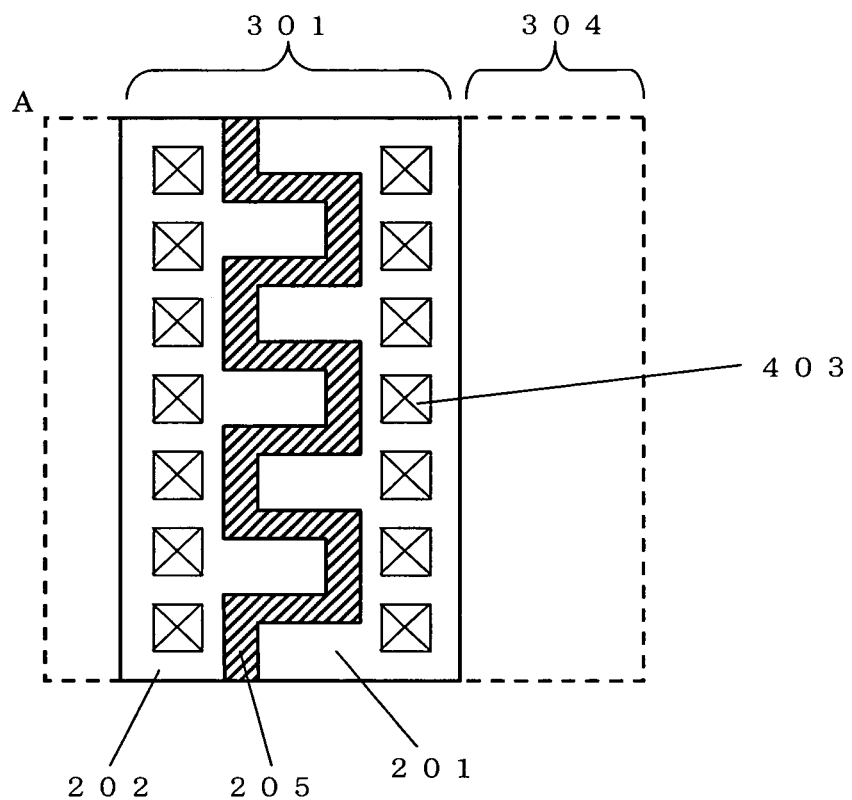
FIG. 5 is a schematic view illustrating a structure of a semiconductor device according to an embodiment of the present invention.
Figure 6:
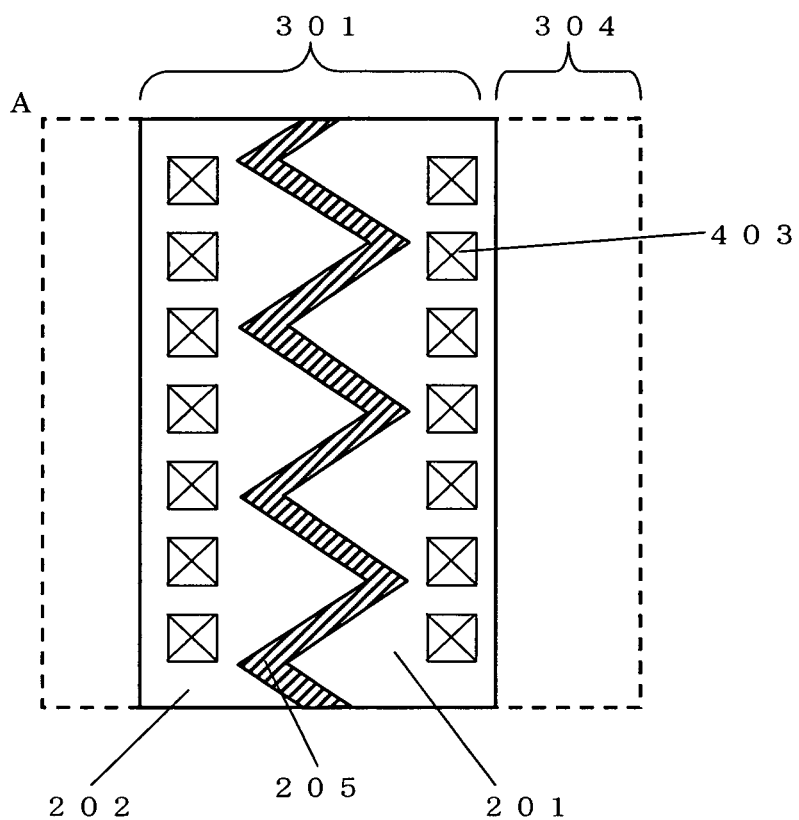
FIG. 6 is a schematic view illustrating a structure of a semiconductor device according to an embodiment of the present invention.
Figure 7:
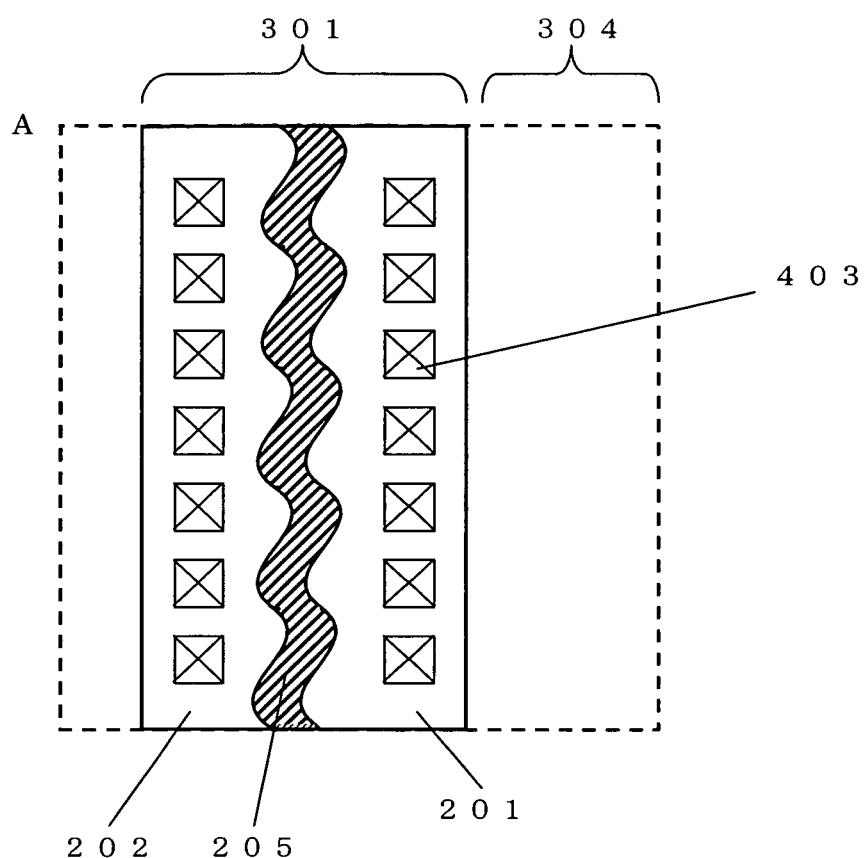
FIG. 7 is a schematic view illustrating a structure of a semiconductor device according to an embodiment of the present invention.
Figure 8:
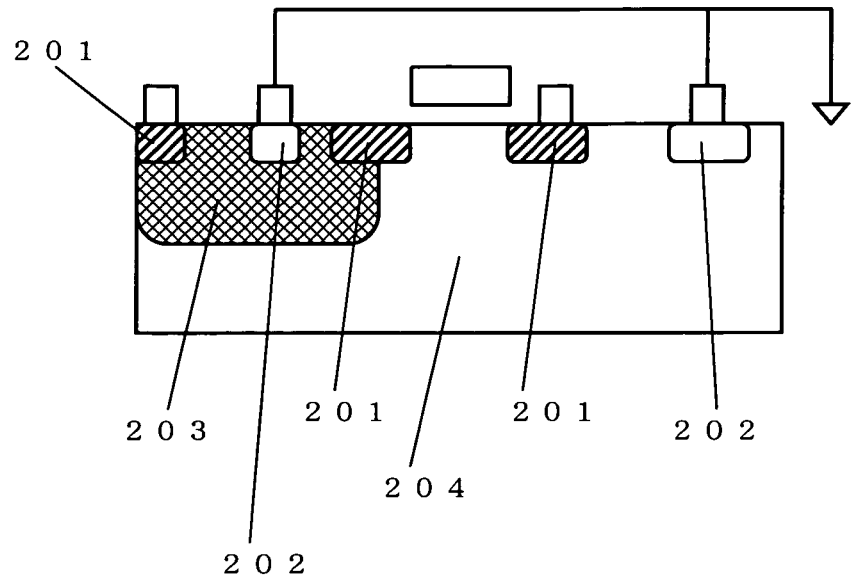
FIG. 8 is a schematic view illustrating a semiconductor device according to a conventional embodiment.

In the description above, the patterns of the p-type and n-type diffusion layers in the diode-type ESD protection circuit are formed linearly in a plane as illustrated in FIG. 2. However, the p+ diffusion layer 202, the n-type diffusion layer 205 for breakdown voltage adjustment, and the n+ diffusion layer 201 may be formed in a rectangle shape illustrated in FIG. 5, in a wedge shape illustrated in FIG. 6, and in a wave shape illustrated in FIG. 7, whereby a pn junction width per unit area can be increased, and the effect of the present invention can be increased more.

Further, though described in the case where the p-type substrate is used, the present invention can also be applied to a case where an n-type substrate is used, by replacing a type of the diffusion layers and a polarity of an applied voltage with contrary ones.

Further, FIG. 1 illustrates a state in which the diode-type ESD protection circuit is formed in the entire peripheral region of the chip, but is not necessarily formed in the entire peripheral region and may be formed in a part of the peripheral region. When the diode-type ESD protection circuit according to the present invention is used in combination with an ESD protection circuit according to a conventional method, immunity to ESD destruction can be further enhanced.

What is claimed is:

1. A semiconductor device, comprising:
a semiconductor chip having a peripheral region;
an internal circuit region arranged on an inner side of the semiconductor chip;
a bonding pad region arranged adjacently to the internal circuit region, an entirety of the peripheral region of the semiconductor chip being arranged outside of the internal circuit region and the bonding pad region; and
a diode-type ESD protection circuit arranged continuously along the entirety of the peripheral region of the semiconductor chip, the diode-type ESD protection circuit being formed of a junction between a first conductivity type diffusion layer for fixing a substrate potential of the semiconductor chip and a pair of second conductivity type diffusion layers having the second conductivity type different from the first conductivity type and arranged on an inner side of the first conductivity type diffusion layer, one of the pair of second conductivity type diffusion layers comprising a diffusion layer for breakdown adjustment at a junction portion with the first conductivity type diffusion layer, the first conductivity type diffusion layer and at least one of the pair of second conductivity type diffusion layers completely surrounding the internal circuit region, and the bonding pad region being disposed between the internal circuit region and the first conductivity type diffusion layer.

2. A semiconductor device according to claim 1; wherein the junction portion of the first conductivity type diffusion layer and the diffusion layer for breakdown adjustment is joined in a linear shape in a plane.

3. A semiconductor device according to claim 1; wherein the junction portion of the first conductivity type diffusion layer and the diffusion layer for breakdown adjustment is joined in a rectangular shape in a plane.

4. A semiconductor device according to claim 1; wherein the junction portion of the first conductivity type diffusion layer and the diffusion layer for breakdown adjustment is joined in a wave shape in a plane.

5. A semiconductor device according to claim 1; wherein the junction portion of the first conductivity type diffusion layer and the diffusion layer for breakdown adjustment is joined in a wedge shape in a plane.

6. A semiconductor device according to claim 1; wherein patterns of the first conductivity type diffusion layer and the pair of second conductivity type diffusion layers are formed linearly in a plane.

7. A semiconductor device comprising:
a semiconductor chip having a peripheral region;
an internal circuit region arranged on an inner side of the semiconductor chip;
a bonding pad region arranged adjacently to the internal circuit region; and
a diode-type ESD protection circuit arranged continuously along an entirety of the peripheral region of the semiconductor chip, the diode-type ESD protection circuit having a first conductivity type diffusion layer for fixing a substrate potential of the semiconductor chip and a pair of second conductivity type diffusion layers having the second conductivity type different from the first conductivity type and arranged on an inner side of the first conductivity type diffusion layer, one of the pair of second conductivity type diffusion layers comprising a diffusion layer for breakdown adjustment at a junction with the first conductivity type diffusion layer, the first conductivity type diffusion layer and at least one of the pair of second conductivity type diffusion layers completely surrounding the internal circuit region, and the bonding pad region being disposed between the internal circuit region and the first conductivity type diffusion layer.

8. A semiconductor device according to claim 7; wherein patterns of the first conductivity type diffusion layer and the pair of second conductivity type diffusion layers are formed linearly in a plane.

9. A semiconductor device according to claim 7; wherein the junction of the first conductivity type diffusion layer and the diffusion layer for breakdown adjustment is joined in a linear shape in a plane.

10. A semiconductor device according to claim 1; wherein the first conductivity type diffusion layer is formed on a semiconductor substrate having the first conductivity type.

11. A semiconductor device according to claim 7; wherein the first conductivity type diffusion layer is formed on a semiconductor substrate having the first conductivity type.

* * * * *